(12) United States Patent
Hidaka

(10) Patent No.: US 7,752,512 B2
(45) Date of Patent: Jul. 6, 2010

(54) SEMICONDUCTOR INTEGRATED CIRCUIT

(75) Inventor: Itsuo Hidaka, Kanagawa (JP)

(73) Assignee: NEC Corporation, Kanagawa (JP)

( * ) Notice: Subject to any disclaimer, the term of this patent is extended or adjusted under 35 U.S.C. 154(b) by 643 days.

(21) Appl. No.: 11/626,574

(22) Filed: Jan. 24, 2007

(65) Prior Publication Data

US 2007/0180340 A1      Aug. 2, 2007

(30) Foreign Application Priority Data

Feb. 2, 2006     (JP) ............................. 2006-026024

(51) Int. Cl.
*G01R 31/28* (2006.01)
(52) U.S. Cl. ................... 714/726; 714/733; 714/734; 714/729; 714/727
(58) Field of Classification Search .................. None
See application file for complete search history.

(56) References Cited

U.S. PATENT DOCUMENTS

| | | | |
|---|---|---|---|
| 6,694,466 B1 * | 2/2004 | Tsai et al. ................... | 714/729 |
| 7,010,732 B2 * | 3/2006 | Firth et al. ................... | 714/718 |
| 7,103,814 B2 * | 9/2006 | Corbin et al. ................ | 714/726 |
| 7,502,976 B2 * | 3/2009 | Ross et al. ................... | 714/718 |
| 2004/0083412 A1 * | 4/2004 | Corbin et al. ................ | 714/726 |
| 2005/0204232 A1 * | 9/2005 | Seuring ....................... | 714/733 |
| 2006/0107142 A1 * | 5/2006 | Inoue .......................... | 714/726 |
| 2006/0184848 A1 * | 8/2006 | Serizawa et al. ............. | 714/727 |
| 2007/0266278 A1 * | 11/2007 | Nadeau-Dostie et al. .... | 714/719 |

FOREIGN PATENT DOCUMENTS

| | | |
|---|---|---|
| JP | 2003-121509 A | 4/2003 |
| JP | 2004-251684 A | 9/2004 |

* cited by examiner

*Primary Examiner*—Kevin L Ellis
*Assistant Examiner*—Guerrier Merant
(74) *Attorney, Agent, or Firm*—Sughrue Mion, PLLC

(57) ABSTRACT

A semiconductor integrated circuit includes: a first circuit having a plurality of scan chains; a second circuit connected with input/output signals of the first circuit; and a third circuit connected with the second circuit through the first circuit. The plurality of scan chains comprises a first scan chain that contains flip-flops whose input/output signals are connected with the second circuit, and a second scan chain that does not contain any flip-flop whose input/output signal is connected with the second circuit. The flip-flops operate as a shift register at a scan path test, and when the third circuit exchanges signals with the second circuit through the flip-flops of the first scan chain, the second scan chain of the first circuit operates as a shift register.

11 Claims, 5 Drawing Sheets

SEMICONDUCTOR INTEGRATED CIRCUIT

BACKGROUND OF THE INVENTION

1. Field of the Invention

The present invention relates to a semiconductor integrated circuit, and particularly to a test circuit of a semiconductor integrated circuit.

2. Description of the Related Art

In a test of a semiconductor integrated circuit, a stress application test is carried out to early detect generation of its initial failure so that defectives products are removed. A circuit for the stress application test is disclosed in Japanese Laid Open Patent Application (JP-P2003-121509A). In this conventional example, a burn-in circuit of the semiconductor integrated circuit has a logic circuit, one or more functional macros, and a built-in self-test circuit. The logic circuit includes a scan chain in an internal circuit. The built-in self-test circuit autonomously carries out a functional macro test provided for every functional macro. In the burn-in circuit of this semiconductor integrated circuit, the logic circuit carries out the burn-in test using the scan chain, and simultaneously the functional macro carries out the burn-in test by means of the testing operation of the built-in self-test circuit. Also, a burn-in scan control circuit is provided to control the burn-in test operation and the scan test operation of the built-in self-test circuit. In this case, a scan test is carried out in the logic circuit and the built-in self-test circuit.

Besides, a semiconductor device is disclosed in Japanese Laid Open Patent Application (JP-P2004-251684A). In this conventional example, the semiconductor device includes a memory, a BIST (built-in self-test) circuit, a digital circuit, and a plurality of flip-flops. The BIST circuit and the plurality of flip-flops can operate in parallel to each other. This BIST circuit automatically tests the memory, and the digital circuit receives outputs from the memory. The plurality of flip-flops receive multiple outputs from the digital circuit, and are connected to one after another to constitute a scan chain, in which the received outputs are sequentially produced through a scan shift operation. The BIST circuit applies a stress to the memory at the time of burn-in, and the plurality of flip-flops apply a stress to the digital circuit by performing the scan shift operation at the time of burn-in.

FIG. 1 is a block diagram showing the configuration of this conventional semiconductor device. This conventional semiconductor device includes a memory 120, a logic circuit 110 for accessing the memory 120, flip-flops 116 and 117 as a final stage of memory access in the logic circuit 110, a BIST circuit 130 for testing the memory 120, flip-flops 136 and 137 as a final stage of memory access in the BIST circuit 130, and selecting circuits 124 and 125. The flip-flops 116 and 117 function as an output circuit of the logic circuit 110 and output signals 161 and 162 to the selecting circuits 124 and 125. Besides, the flip-flops 116 and 117 constitute a scan chain in response to a control signal 141, input a serial input signal 151 at the time of a scan path test, and output a serial output signal 152. The flip-flops 136 and 137 output signals 163 and 164 to the selecting circuits 124 and 125 as an output circuit of the BIST circuit when the BIST circuit is operated. In addition, the flip-flops 136 and 137 constitute another scan chain in response to a control signal 142, input a serial input signal 153 at the time of the scan path test, and output a serial output signal 154. The selecting circuits 124 and 125 select either signals 161 and 162, which are outputted from the flip-flops 116 and 117, or signals 163 and 164, which are outputted from the flip-flops 136 and 137, and output the selected signals to the memory 120 as output signals 165 and 166. The memory 120 outputs an output signal 167 to the logic circuit 110 and the BIST circuit 130.

In this conventional semiconductor device, the scan chain is constituted by the logic circuit 110 and the flip-flops 116 and 117 at the time of burn-in test. On the one hand, signals outputted from the BIST circuit 130 are received through the flip-flops 136 and 137 at the rear stage of the BIST circuit to the memory 120. The scan chain, to which the flip-flops 136 and 137 at the rear stage of the BIST circuit are connected, is separated from the scan chain, to which the flip-flops 116 and 117 at the rear stage of the logic circuit 110 are connected. Accordingly, the flip-flops 136 and 137 at the rear stage of the BIST circuit 130 can be operated without performing the scan shift at the time of the burn-in test. Therefore, when the logic circuit 110 is operating the scan shift, it is possible to operate a path from the BIST circuit 130 to the memory 120, so that the memory 120 can be activated from the BIST circuit 130. That is to say, the BIST circuit 130 operates to activate the memory 120, and the scan chain operates in response to the control signal 141 to activate the logic circuit 110 and the flip-flops 116 and 117.

The signals 163 and 164 outputted from the flip-flops 136 and 137 at the rear stage of the BIST circuit 130 activate the memory 120 through the selecting circuits 124 and 125. That is to say, since a path of the BIST circuit 130 for the purpose of accessing the memory 120 does not pass through the flip-flops 116 and 117, it differs from a path of the logic circuit 110 for the purpose of accessing the memory 120. Accordingly, the BIST circuit 130 accesses the memory 120 at a different timing from the logic circuit 110. Therefore, it is not possible to carry out a burn-in test which requires application of sufficient stress to the memory.

SUMMARY OF THE INVENTION

In an object of the present invention, a semiconductor integrated circuit includes: a first circuit having a plurality of scan chains; a second circuit connected with input/output signals of the first circuit; and a third circuit connected with the second circuit through the first circuit. The plurality of scan chains comprises a first scan chain that contains flip-flops whose input/output signals are connected with the second circuit, and a second scan chain that does not contain any flip-flop whose input/output signal is connected with the second circuit. The flip-flops operate as a shift register at a scan path test, and when the third circuit exchanges signals with the second circuit through the flip-flops of the first scan chain, the second scan chain of the first circuit operates as a shift register.

Here, the first circuit may include a selecting circuit section may select one of output signals from the third circuit and signals from the first circuit in response to a control signal. The first scan chain may include the flip-flops configured to hold the signals outputted from the selecting circuit section to output to the second circuit.

Also, the third circuit is a BIST (Built-In Self-Test) circuit configured to test a normal operation of the second circuit.

Also, the third circuit may have a third scan chain, and the third scan chain and the first scan chain may form a continuous scan chain.

Also, the second circuit may be a memory configured to store data from the first circuit.

Also, the second circuit may include a macro circuit in which a pattern of an output signal to a pattern of an input signal is known.

In another aspect of the present invention, a semiconductor integrated circuit includes: a first macro circuit comprising a group of flip-flops; a second macro circuit to which a signal is supplied from the first macro circuit through the flip-flop group; and a testing circuit configured to supply a test signal to the second macro circuit through the flip-flop group when the second macro circuit is tested.

Here, the flip-flop group may be a circuit at a final stage configured to output the signal supplied from the first macro circuit to the second macro circuit in a normal operation.

Also, the first macro circuit may include: a plurality of scan chains in which the flip-flops operate as a shift register, and at least one of the plurality of scan chains comprises the flip-flop group.

Also, when the testing circuit tests the second macro circuit, the first macro circuit may perform a scan path test by using the plurality of scan chains other than the flip-flop group.

Also, the second macro circuit may be a memory circuit, and the testing circuit may be a BIST circuit configured to test a normal operation of the second macro circuit.

According to the present invention, it is possible to provide a semiconductor device, which applies sufficient stress to the memory at the time of a burn-in test, without decreasing a memory access rate during normal operation.

DESCRIPTION OF THE PREFERRED EMBODIMENTS

Figure 1:
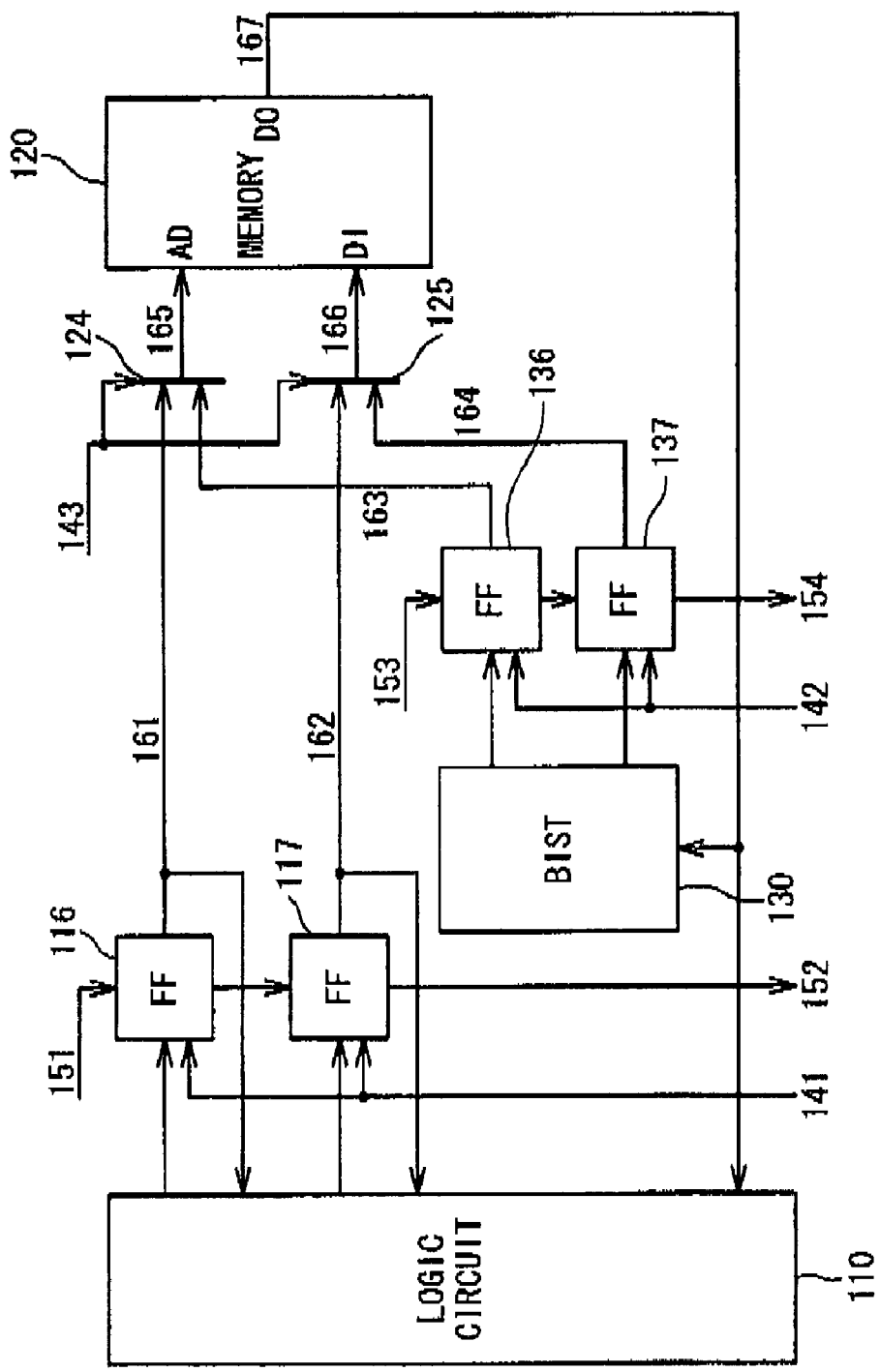
FIG. 1 is a block diagram showing the configuration of a test circuit of a conventional semiconductor device.
Figure 2:
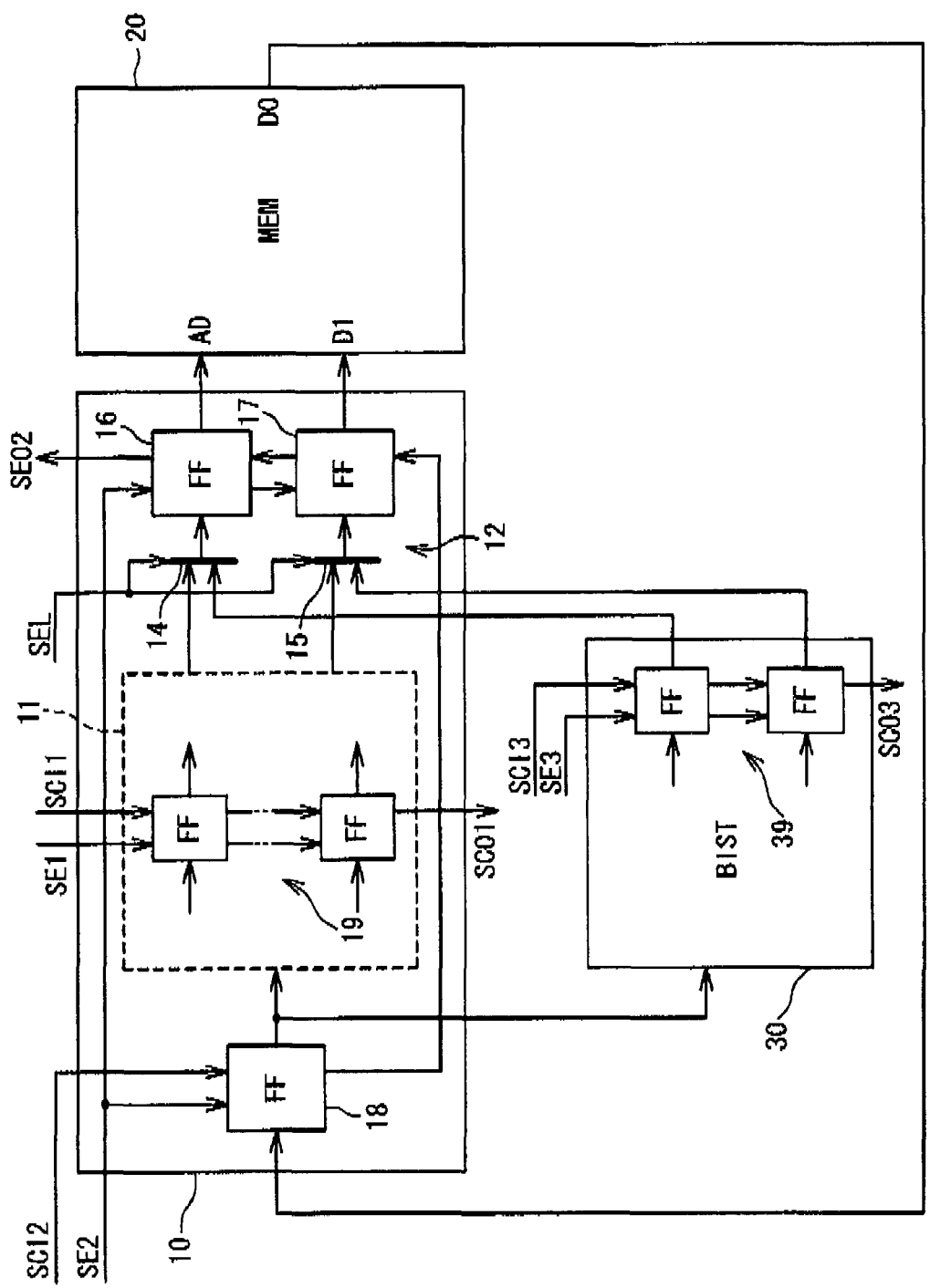
FIG. 2 is a block diagram showing the configuration of a semiconductor integrated circuit according to an embodiment of the present invention.

Hereinafter, a semiconductor integrated circuit of the present invention will be described with reference to the attached drawings. FIG. 2 is a block diagram showing the configuration of the semiconductor integrated circuit according to an embodiment of the present invention. The semiconductor integrated circuit includes a scan chain to test an internal logic and a BIST (Built-In Self-Test) circuit to test a memory.

The semiconductor integrated circuit includes a main circuit 10, a memory circuit 20 and a BIST circuit 30. The main circuit 10 and the memory circuit 20 are macro blocks. The main circuit 10 includes an internal logic circuit 11 and a memory interface circuit 12, and accesses the memory circuit 20. The BIST circuit 30 generates a test pattern to be supplied to the memory circuit 20, compares an output from the memory circuit 20 with an expected value, for a test of the memory circuit 20. The main circuit 10 and the BIST circuit 30 are target circuits of scan path tests, and each of them has at least one scan path or a scan chain containing flip-flops which operate as a shift register.

The internal logic circuit 11 of the main circuit 10 includes a scan chain 19 for the scan path test. Flip-flops constituting the scan chain 19 receive, hold and output signals in the internal logic circuit 11 in a normal operation. The scan chain 19 operates as a shift register in response to a control signal SE1 to receive a serial input signal SCI1 and output a serial output signal SCO1.

A memory interface circuit 12 of the main circuit 10 includes selecting circuits 14 and 15 and flip-flops 16 to 18. The flip-flops 16 and 17 receive output signals from the selecting circuits 14 and 15 to output to the memory circuit 20. The flip-flop 18 receives an output signal from the memory circuit 20 to output to the internal logic circuit 11 and the BIST circuit 30. Besides, the flip-flops 16 to 18 constitute a scan chain at the time of s scan path test. The scan chain constituted by the flip-flops 16 to 18 operate as a shift register in response to a control signal SE2 to receive a serial input signal SCI2 and to output a serial output signal SCO2.

The internal logic circuit 11 outputs the signals to the flip-flops 16 and 17 through the selecting circuits 14 and 15 for accessing the memory circuit 20. The selecting circuits 14 and 15 receive the signals outputted from the internal logic circuit 11 and the signals outputted from the BIST circuit 30 toward the memory circuit 20 and select and output one of them in response to the selection signal SEL. Since the output signals of the selecting circuits 14 and 15 are connected to the flip-flops 16 and 17, the selecting circuits 14 and 15 are a target of the scan path test. The flip-flops 16 and 17 output the signals outputted from the selecting circuits 14 and 15 to the memory circuit 20 according to the access timing. The flip-flop 18 receives and holds the signal outputted from the memory circuit 20 to output to the internal logic circuit 11 and the BIST circuit 30.

The BIST circuit 30 includes a scan chain 39 for the scan path test. Flip-flops constituting the scan chain 39 receive, hold and output signals in the BIST circuit 30 when the BIST circuit 30 operates as an original self-test circuit. The scan chain 39 operates as a shift register in response to a control circuit SE3, receives a serial input signal SCI3, and outputs a serial output signal SCO3. The scan chains 19 and 39 have a clock signal for the shift timing, input/output signals of data, and so forth. However, its description is omitted in this specification.

An operation of the semiconductor integrated circuit in the normal mode will be described with reference to FIG. 3. Since an original functional operation of the semiconductor integrated circuit is carried out, signals are transmitted and received between the main circuit 10 and the memory circuit 20.

The signals outputted from the internal logic circuit 11 are selected in response to the selection signal SEL. The flip-flops in the internal logic circuit 11 receive and output the signals in the internal logic circuit 11 without constituting a scan chain 19, in response to the control signal SE1. Similarly, the flip-flops 16 to 18 receive the output signals of the internal logic circuit 11 or the memory circuit 20 and output to the memory circuit 20 and the internal logic circuit 11 without constituting a scan chain, in response to the control signal SE2. Since the BIST circuit 30 is not used, it may be in a halt state.

Figure 3:
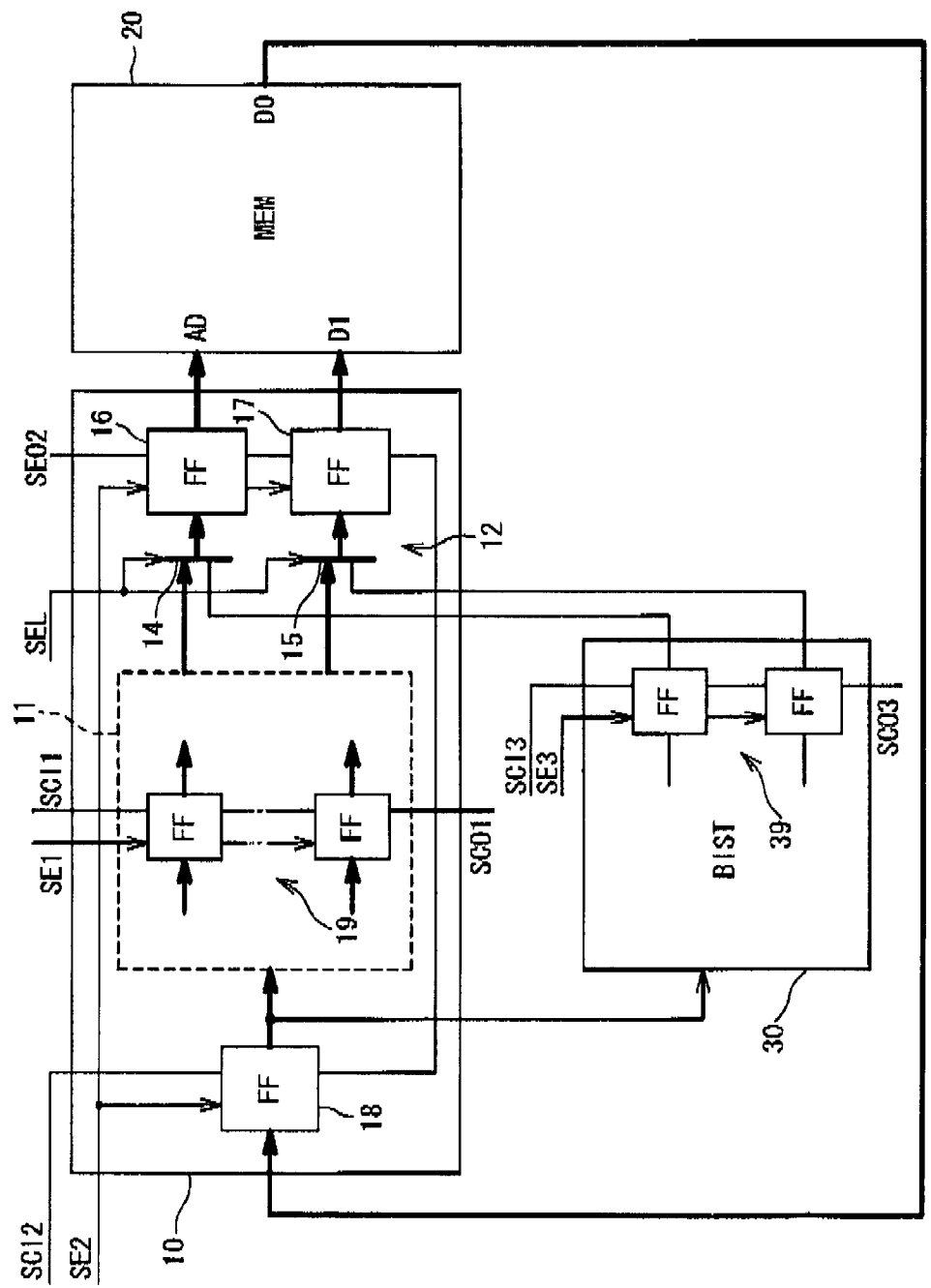
FIG. 3 is a circuit diagram showing a signal flow in a normal operation of the semiconductor integrated circuit according to the embodiment of the present invention.

Therefore, as shown by a thick line in FIG. 3, the output signals of the internal logic circuit 11 are received through the selecting circuits 14 and 15 by the flip-flops 16 and 17. The flip-flops 16 and 17 supply an address signal AD and a data input signal DI to the memory circuit 20. A data output signal DO outputted from the memory circuit 20 is received by the flip-flop 18 and transferred to the internal logic circuit 11. As described above, the internal logic circuit 11 operates in the normal operation mode on the basis of the data stored in the memory circuit 20 and the internal state, and data is stored in the memory circuit 20.

Figure 4:
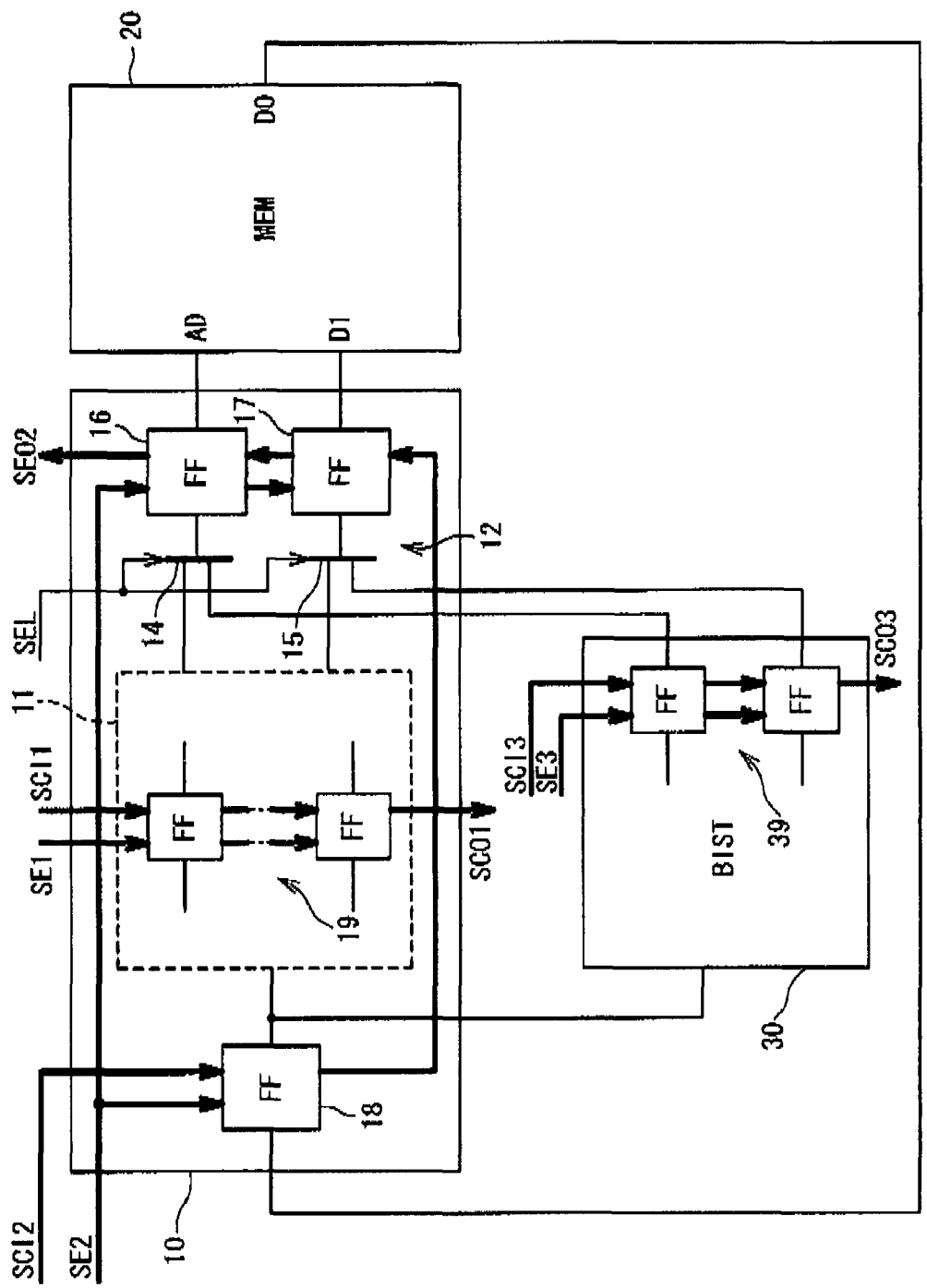
FIG. 4 is a circuit diagram showing a signal flow at the time of a scan path test of the semiconductor integrated circuit according to the embodiment of the present invention.

An operation of the semiconductor integrated circuit at the time of the scan path test will be described with reference to FIG. 4. This is a test operation to confirm a normal operation of the semiconductor integrated circuit. The scan path test is carried out in the main circuit 10 and the BIST circuit 30.

The flip-flops in the internal logic circuit 11 constitute the scan chain 19 in response to the control signal SE1. The flip-flops 16 to 18 constitute the scan chain in response to the control signal SE2. The flip-flops in the BIST circuit 30 constitute the scan chain 39 in response to the control signal SE3. Therefore, as shown by a thick line in FIG. 4, the internal logic circuit 11 of the main circuit 10 is tested by supplying the serial input signal SCI1 to the scan chain 19, and the result of the test is outputted as a serial output signal SCO1. The interface circuit 12 of the main circuit 10 is tested by supplying the serial input signal SCI2 to the flip-flops 16 to 18 constituting the scan chain, and the result of the test is outputted as a serial output signal SCO2. It is preferable that the scan path test for the internal logic circuit 11 and the interface circuit 12 is carried out simultaneously. The BIST circuit 30 is tested by supplying the serial input signal SCI3 to the scan chain 39, and the result of the test is outputted as a serial output signal SCO3. As described above, the scan path test is carried out in the main circuit 10 and the BIST circuit 30.

Figure 5:
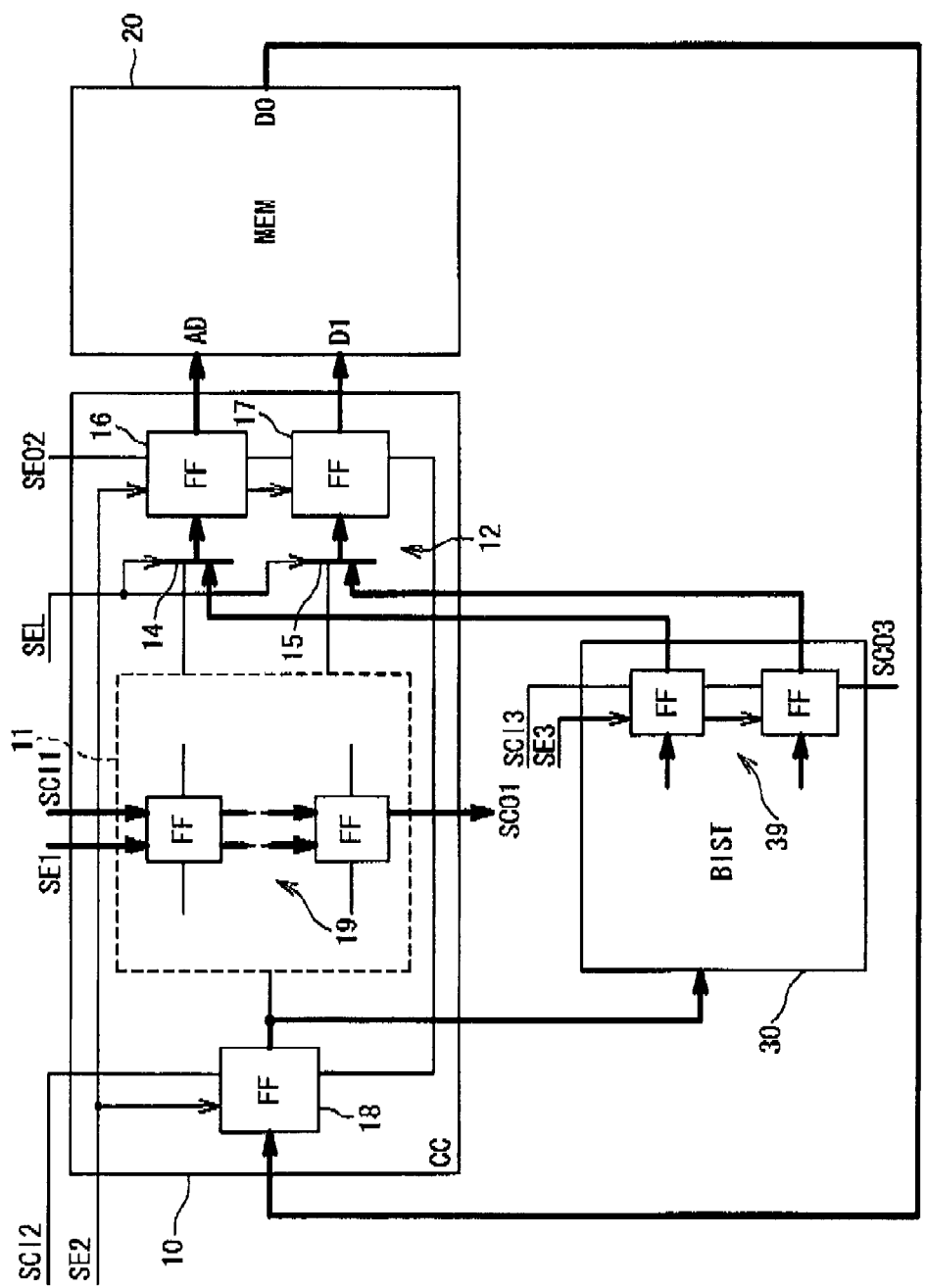
FIG. 5 is a circuit diagram showing a signal flow at the time of a burn-in test of the semiconductor integrated circuit according to the embodiment of the present invention.

An operation of the semiconductor integrated circuit at the time of a burn-in test will be described with reference to FIG. 5. The burn-in test is a test in which a stress is applied to early detect generation of initial defect. Therefore, the main circuit 10, the memory circuit 20 and the BIST circuit 30 all operate to apply the stress.

The outputs of the BIST circuit 30 are selected and supplied to the flip-flops 16 and 17 in response to the selection signal SEL. The flip-flops in the internal logic circuit 11 constitute the scan chain 19 in response to the control signal SE1. In response to the control signal SE2, the flip-flops 16 to 18 receive the output signals of the selecting circuits 14 and 15 and output to the memory circuit 20 without functioning as the scan chain. The control signal SE3 is set so that the flip-flops in the BIST circuit 30 do not constitute the scan chain 39. Therefore, as shown by a thick line in FIG. 5, the internal logic circuit 11 of the main circuit 10 is tested by supplying the serial input signal SCI1 to the scan chain 19, and the result of the test is outputted as a serial output signal SCO1. Besides, the flip-flops 16 and 17 of the memory interface circuit 12 receive the output signals of the selecting circuits 14 and 15 to supply to the memory circuit 20. The flip-flop 18 receives the output signal from the memory circuit 20 and supplies it to the BIST circuit 30. That is to say, the BIST circuit 30 generates a test pattern to supply to the memory circuit 20, receives the output signal from the memory circuit 20 through the flip-flop 18, and compares it with an expected value for a test of the memory circuit 20.

As described above, in the main circuit 10, the scan chain of the flip-flops 16, 17 and 18 of the memory interface circuit 12 is separated from the scan chain 19 of the internal logic circuit 11. Accordingly, it is possible to perform a normal operation by the flip-flops 16, 17 and 18 and the flip-flops of the scan chain 39 in the BIST circuit 30 without performing a shift register operation, while performing a shift register operation by the scan chain 19. Therefore, at the time of the burn-in test, an activation of the memory 20 by means of the BIST circuit 30 can be carried out simultaneously with the activation of the logic of the internal logic circuit 11 by the scan chain 19. At this time, the output signals of the BIST circuit 30 reach the memory circuit 20 via the selecting circuits 14 and 15 and the flip-flops 16 and 17 in the memory interface circuit 12. Besides, the output signal of the memory circuit 20 is supplied to the BIST circuit 30 through the flip-flop 18.

At the time of the scan path test, in this semiconductor integrated circuit, a normal scan path test can be done by controlling the control signals SE1, SE2 and SE3 and performing the scan shift operation of the scan chains 19 and 39 and the scan chain of the flip-flops 16 to 18. At this time, the scan chain 39 may be connected with the scan chain of the flip-flops 16 to 18 to constitute a continuous scan chain. These scan chains are separated from the scan chain 19 of the internal logic circuit 11. Accordingly, all scan chains can perform the shift operation at the time of the scan path test, only the scan chain 19 can perform the scan path test operation at the time of the burn-in test, and the flip-flops in the scan chain 39 and the flip-flops 16 to 18 can operate as normal flip-flops without performing the shift operation.

As described above, the signal path from the BIST circuit 30 to the memory circuit 20 passes through the selecting circuits 14 and 15 and the flip-flops 16 and 17, similar to the signal path from the internal logic circuit 11 to the memory circuit 20. Therefore, the path to the memory circuit 20 can be activated by the actually operating path. Therefore, activation of the memory 20 by the BIST circuit 30 at the time of the burn-in test can be carried out at an actually operation rate by the actually operating path. Accordingly, since the operation of the memory activation approaches the actual operation, the effect of stress application to the memory circuit 20 and the internal logic circuit 11 can be improved. That is to say, the effect of the burn-in test can be expected to be improved. Besides, as shown in the conventional example, when signals are selected by providing selecting circuits between a memory and flip-flops, a memory access rate decreases. According to the present invention, since the signals selected by the selecting circuit are received by the flip-flops which are directly connected to the memory, an access rate will not decrease. Moreover, since the flip-flops are located at the final stage of the memory access, the scan path test including the selecting circuit can be carried out.

Although the flip-flops 16 to 18 have been described as a single circuit to simplify the circuit configuration in the above, these signals are often connected in the form of a bus, and they are a plurality of flip-flop circuits. In this case, the scan chain including the plurality of flip-flops is formed by cascade-connecting individual flip-flops. Moreover, there may be multiple scan chains under different control from the scan chain 19 of the internal logic circuit 11. Moreover, although the internal logic circuit 11 is provided with the scan chain 19, and the BIST circuit 30 is provided with the scan chain 39, the internal logic circuit 11 and the BIST circuit 30 may be provided with multiple scan chains, respectively. Besides, a test target of the BIST circuit 30 is the memory circuit 20 as described above. However, a test target is not limited to a memory, but may be a so-called black box circuit being not clear in circuit configuration. Since a pattern of an output signal for a pattern of an input signal is found in this black box circuit such as a macro circuit of a user, the test of the BIST circuit 30 confirms normality of a circuit.

What is claimed is:

1. A semiconductor integrated circuit comprising:
   a first circuit including a first scan chain and a second scan chain each including a plurality of flip-flops and configured to perform a scan path test;
   a second circuit configured to receive a signal from said first circuit in a normal operation mode through a first flip-flop being one of said plurality of flip-flops included in said first scan chain and a signal path which couples said first flip-flop with said second circuit; and a third circuit configured to exchange signals with said second circuit through said first flip-flop and said signal path without an intervention of a second flip-flop being one of said plurality of flip-flops included in said second scan chain when said third circuit tests said second circuit; and a third circuit configured to exchange signals with said second circuit through said first flip-flop and said signal path without an intervention of a second flip-flop being one of said plurality of flip-flops included in said second scan chain when said third circuit tests said second circuit, wherein said second scan chain performs said scan path test when said third circuit exchanges signals with said second circuit through said first flip-flop and said signal path without an intervention of said second flip-flop.

2. The semiconductor integrated circuit according to claim 1, wherein said first circuit comprises a selecting circuit section coupled to an internal logic of said first circuit and said first flip-flop to select one of output signals from said internal logic and said third circuit, and to output said selected one of output signals to said first flip-flop.

3. The semiconductor integrated circuit according to claim 1, wherein said third circuit is a BIST (Built-In Self Test) circuit configured to test a normal operation of said second circuit.

4. The semiconductor integrated circuit according to claim 1, wherein said third circuit comprises a third scan chain, and said third scan chain and said first scan chain form a continuous scan chain.

5. The semiconductor integrated circuit according to claim 1, wherein said second circuit is a memory configured to store data from said first circuit.

6. The semiconductor integrated circuit according to claim 1, wherein said second circuit comprises a macro circuit in which a pattern of an output signal to a pattern of an input signal is made clear.

7. The semiconductor integrated circuit according to claim 1, wherein said first scan chain performs said scan path test for testing an interface circuit included in said first circuit.

8. The semiconductor integrated circuit according to claim 1, wherein said second scan chain performs said scan path test for testing an internal logic included in said first circuit.

9. The semiconductor integrated circuit according to claim 1, wherein said first and second scan chains perform said scan path test simultaneously.

10. The semiconductor integrated circuit according to claim 1, wherein said first scan chain does not perform said scan path test when said third circuit exchanges signals with said second circuit through said first flip-flop and said signal path without an intervention of said second flip-flop.

11. The semiconductor integrated circuit according to claim 1, wherein said first scan chain comprises a third flip-flop coupled to said second circuit to hold a signal outputted from said second circuit and to output said signal outputted from said second circuit to said third circuit.

* * * * *